(12) United States Patent
Sawagashira

(10) Patent No.: US 9,704,776 B2
(45) Date of Patent: Jul. 11, 2017

(54) SEMICONDUCTOR DEVICE HAVING SEMICONDUCTOR MODULE AND COOLER COUPLED WITH BOLT

(71) Applicant: FUJI ELECTRIC CO., LTD., Kawasaki-shi (JP)

(72) Inventor: Ryuichi Sawagashira, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 0 days.

(21) Appl. No.: 15/205,655

(22) Filed: Jul. 8, 2016

(65) Prior Publication Data
US 2016/0322278 A1  Nov. 3, 2016

Related U.S. Application Data

(63) Continuation of application No. PCT/JP2015/065350, filed on May 28, 2015.

(30) Foreign Application Priority Data

Jul. 17, 2014 (JP) .................................. 2014-146999

(51) Int. Cl.
*H01L 23/48* (2006.01)
*H01L 23/40* (2006.01)
*H01L 23/473* (2006.01)
*H01L 23/24* (2006.01)
*H01L 25/07* (2006.01)

(52) U.S. Cl.
CPC ........ *H01L 23/4006* (2013.01); *H01L 23/473* (2013.01); *H01L 23/24* (2013.01); *H01L 25/072* (2013.01); *H01L 2924/0002* (2013.01)

(58) Field of Classification Search
CPC ...... H01L 23/40; H01L 23/46; H01L 23/4006
See application file for complete search history.

(56) References Cited

U.S. PATENT DOCUMENTS 4,204,248 A * 5/1980 Proffit ................. H01L 23/3672
174/16.3
5,283,467 A * 2/1994 Goeschel ............ H01L 23/4006
165/80.3
(Continued)

FOREIGN PATENT DOCUMENTS

JP        H02-79051 U     6/1990
JP        H10-229149 A    8/1998
(Continued)

OTHER PUBLICATIONS

PCT, "International Search Report for International Application No. PCT/JP2015/065350".

*Primary Examiner* — Nicholas Tobergte
(74) *Attorney, Agent, or Firm* — Manabu Kanesaka

(57) ABSTRACT

The present invention provides a semiconductor device that is reduced in size by changing the structure of a fixing portion used for fixing a semiconductor module to a cooler. Bolts 17 are inserted through first through-holes 4 of external conductive terminals 3, second through-holes 6 formed in a resin frame 5, and third through-holes 10 formed in a top plate 9, and the ends of the bolts 17 are screwed to resin nuts 16. External wiring 25, the external conductive terminals 3, a semiconductor module 1, and a cooler 2 are fastened by the bolts 17, thereby fixing the whole members.

4 Claims, 10 Drawing Sheets

(56) References Cited

U.S. PATENT DOCUMENTS

| | | | | |
|---|---|---|---|---|
| 8,519,532 B2 * | 8/2013 | Lenniger | ............... | H01L 23/473 257/691 |
| 2003/0151128 A1 * | 8/2003 | Kawaguchi | ........... | H01L 25/072 257/691 |
| 2005/0035438 A1 | 2/2005 | Shibuya et al. | | |
| 2011/0304039 A1 | 12/2011 | Miyamoto | | |
| 2013/0062750 A1 | 3/2013 | Lenniger et al. | | |
| 2014/0246768 A1 * | 9/2014 | Soyano | ................. | H02M 7/003 257/691 |

FOREIGN PATENT DOCUMENTS

| | | | |
|---|---|---|---|
| JP | 2003-243607 | A | 8/2003 |
| JP | 2004-103936 | A | 4/2004 |
| JP | 2005-064291 | A | 3/2005 |
| JP | 2007-150214 | A | 6/2007 |
| JP | 2007-214281 | A | 8/2007 |
| JP | 2012-004218 | A | 1/2012 |
| JP | 2013-062506 | A | 4/2013 |

\* cited by examiner

SEMICONDUCTOR DEVICE HAVING SEMICONDUCTOR MODULE AND COOLER COUPLED WITH BOLT

CROSS-REFERENCE TO RELATED APPLICATION

This is a continuation application of PCT International Application No. PCT/JP2015/065350 filed on May 28, 2015, which claims a priority of Japanese Patent Application No. 2014-146999 filed on Jul. 17, 2014.

TECHNICAL FIELD

The present invention relates to a semiconductor device having a semiconductor module and a cooler, and more specifically to a technique for downsizing a semiconductor device.

BACKGROUND ART

FIGS. 6 to 10 each show an example of a conventional semiconductor device. FIG. 6 is a top view showing the principal portions, FIG. 7 a cross-sectional diagram of the principal portions, taken along line X1-X1 of FIG. 6, FIG. 8 a cross-sectional diagram of the principal portions, taken along line X2-X2 of FIG. 6, FIG. 9 a cross-sectional diagram of the principal portions, taken along line Y-Y of FIG. 6, and FIG. 10 a cross-sectional diagram of the principal portions in which external wiring 75 is connected to a semiconductor device 500. FIG. 6 is a top view of the principal portions, with a lid 72 being removed from an upper part of the semiconductor device, in which wiring for a semiconductor chip 73 is not shown.

This semiconductor device 500 has a semiconductor module 51 and a cooler 52. The semiconductor module 51 has a resin frame 55. This resin frame 55 is mounted with external conductive terminals 53 with first fixing holes 54, and nut portions 57 that are disposed under the first fixing holes 54 and have screw holes opened therein. In addition, as shown in FIG. 7, a second fixing hole 83 for fixing the semiconductor module 51 and the cooler 52 is formed in each of the four corners of the resin frame 55. A metal tube 82 and the like are disposed in an upper inner circumference of each of the second fixing holes 83. Through-holes 81 of the metal tubes 82 form parts of the second fixing holes 83. The cooler 52 has a top plate 59 disposed under the semiconductor module 51, and a bottom plate 63 having screw portions 66 for fixing the top plate 59. The semiconductor module 51 and the cooler 52 are fixed to each other with bolts 84 inserted through the second fixing holes 83. A plurality of fins 62 is disposed on the lower surface of the top plate 59. A space surrounded with the top plate 59 and bottom plate 63 is formed as a refrigerant passage 70 through which a refrigerant such as water flows. The lower surface of a DCB (Direct Copper Bonding) substrate 74 is soldered to the upper surface of the top plate 59, and semiconductor chips 73 are adhered to the upper surface of the DCB substrate 74. Spaces inside the resin frame 55 are filled with a protective member 71 such as a gel.

The symbol "Lo" shown in the diagrams represents the width of the semiconductor device 500 as viewed in a planar direction, and the symbol "Mo" represents the length of the same. As the external conductive terminals 53 on the upper surface of the semiconductor device 500, P-terminals and N-terminals that receive input of a DC voltage are disposed side by side in a row in the lower section of FIG. 6, and three AC terminals that output a three-phase AC voltage are disposed side by side in a row in the upper section of FIG. 6.

As shown in FIG. 10, the external wiring 75 and the external conductive terminals 53 are fixed with bolts 67.

PTL 1 below discloses a structure in which a semiconductor device is thread-fastened to a heat sink through the inside of a package seat of the semiconductor device, with an insulation sheet interposed between the semiconductor device and the heat sink.

PTL 2 and PTL 3 below each disclose a semiconductor device that is screwed to a cooler through a part protruding to the outside of a semiconductor module.

CITATION LIST

Patent Literature

PTL 1 Japanese Patent Application Laid-open No. 2005-64291
PTL 2 Japanese Patent Application Laid-open No. 2012-4218
PTL 3 Japanese Patent Application Laid-open No. 2007-214281

SUMMARY OF INVENTION

Technical Problem

In the conventional semiconductor device 500 as shown in FIGS. 6 to 10, the sections in which the second fixing holes are disposed (the four sections where the bolts 84 are installed) are dead spaces that cannot be used for electric conduction. Therefore, it is required to downsize the semiconductor device 500 by eliminating such dead spaces. The semiconductor device described in PTL 1 also has a dead space in the case because the semiconductor device is thread-fastened inside the package seat.

On the other hand, the semiconductor devices described in PTL 2 and PTL 3 have large external forms due to the protrusion of the screwed sections from the semiconductor module main body.

An object of the present invention is to provide a semiconductor device that is reduced in size by changing the structure of a fixing portion used for fixing a semiconductor module to a cooler.

Solution to Problem

In order to achieve the foregoing object, a semiconductor device of the present invention includes a semiconductor module and a cooler bonded to each other by a bolt, wherein the semiconductor module is provided with an external conductive terminal with a first through-hole, and a second through-hole that communicates with the first through-hole and disposed under the first through-hole. The cooler has a top plate that has a third through-hole communicating with the second through-hole and has a fin adhered thereto, and a bottom plate that has a depressed portion for accommodating the fin and forming a refrigerant passage and a side portion surrounding the depressed portion. The side portion of the cooler is provided with a screw hole for a female screw that is aligned with the third through-hole, the bolt has a head portion with a larger outer diameter than the first through-hole and a shaft portion that extends from the head portion, is inserted through the first through-hole, the second through-hole, and the third through-hole and screwed and tightened to the screw hole. The external conductive terminal is configured not to conduct electricity to the cooler through the bolt.

In the semiconductor device of the present invention, it is preferred that the bolt, the top plate of the cooler, and the bottom plate of the cooler be made of metal, that the screw hole be a screw hole that is threaded in a nut made of an insulation material that is embedded in a side portion of the cooler, and that an inner surface of the third through-hole have an insulation layer.

In the semiconductor device of the present invention, it is preferred that the bolt be made of an insulation material, that the top plate and the bottom plate of the cooler be made of metal, and that the screw hole be a screw hole that is threaded in a nut made of an insulation material that is embedded in a side portion of the cooler.

In the semiconductor device of the present invention, it is preferred that the bolt be made of an insulation material, that the top plate and the bottom plate of the cooler be made of metal, and that the screw hole be a screw hole that is directly threaded to the bottom plate of the cooler.

Advantageous Effects of Invention

According to the present invention, the bolt inserted through the external conductive terminal is configured to fix the semiconductor module and the cooler to each other, eliminating the need to dispose a special bolt designed for fixing the semiconductor module and the cooler to each other. Therefore, the space for such a bolt can be saved, and downsizing of the semiconductor device can be accomplished.

DESCRIPTION OF EMBODIMENTS

Embodiments of a semiconductor device according to the present invention are described hereinafter with reference to the drawings.

Figure 1:
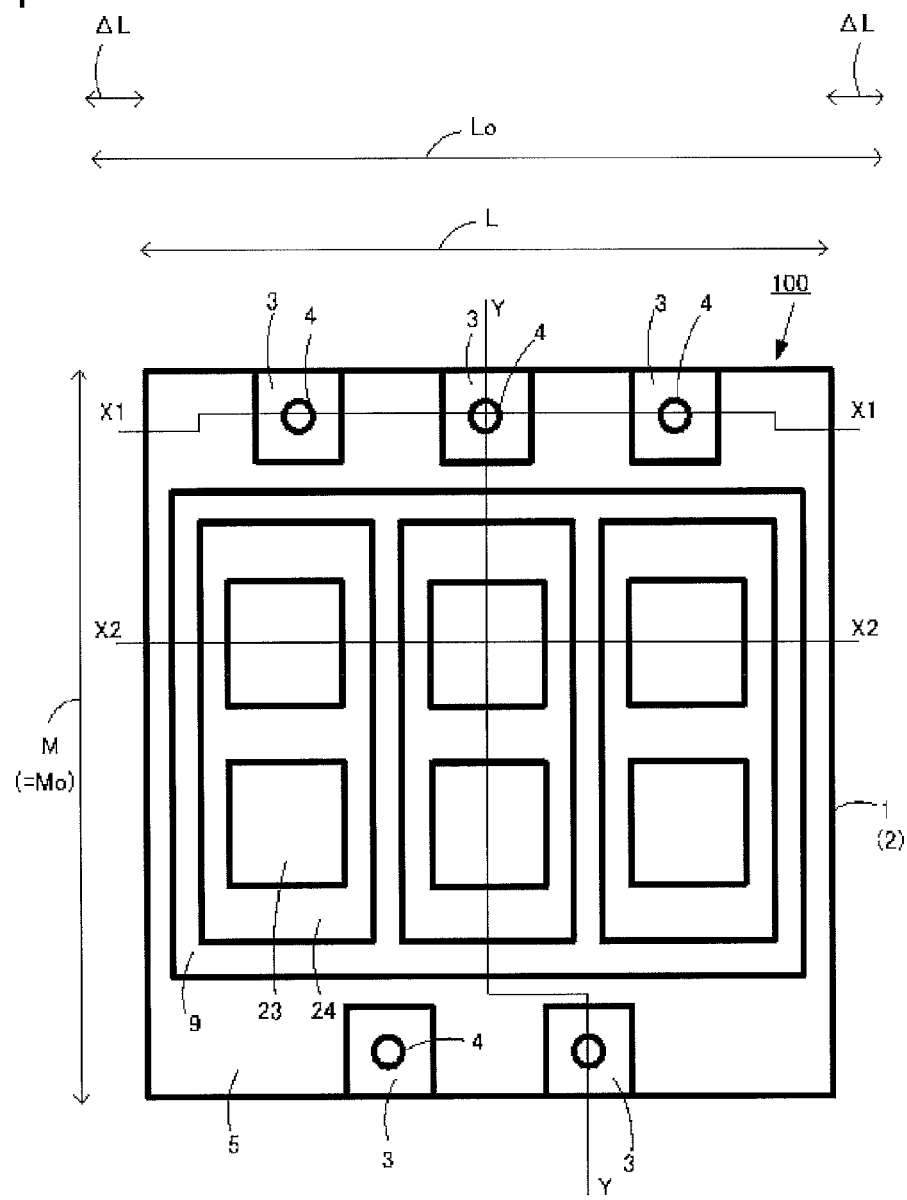
FIG. 1 is a top view showing the principal portions expressing an embodiment of a semiconductor device of the present invention.
Figure 2:
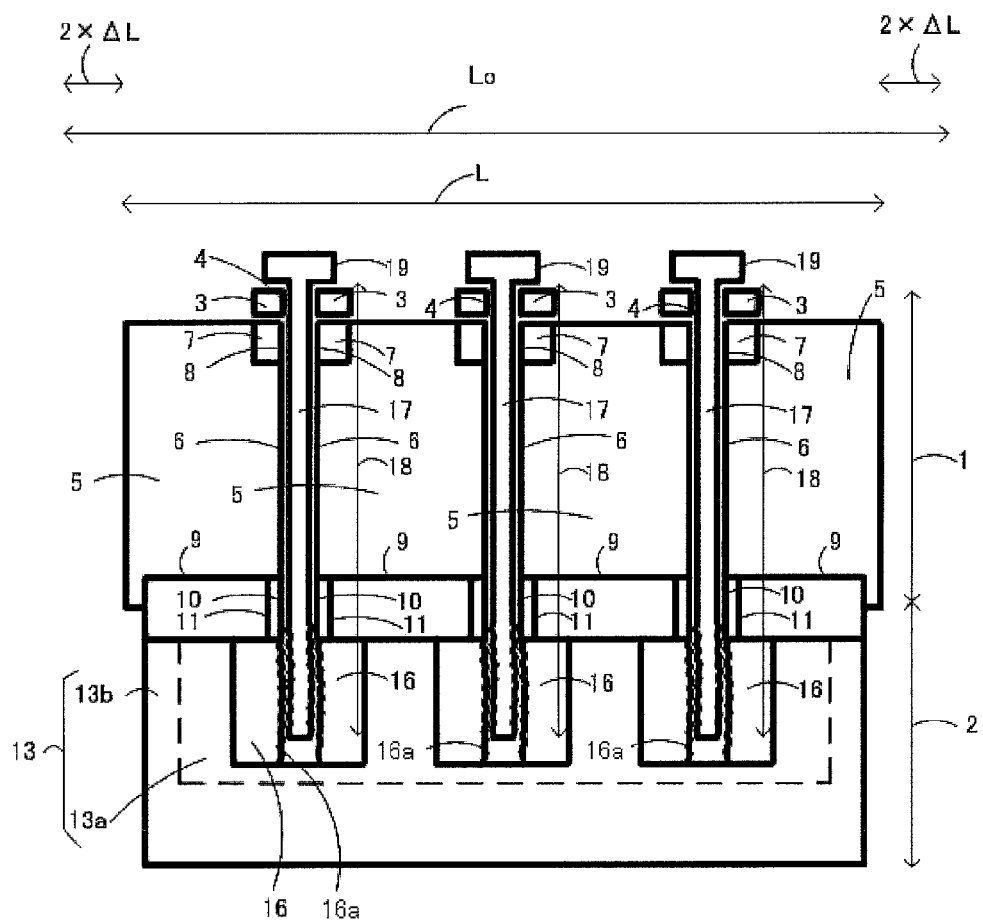
FIG. 2 is a cross-sectional diagram of the principal portions, taken along line X1-X1 of FIG. 1.
Figure 3:
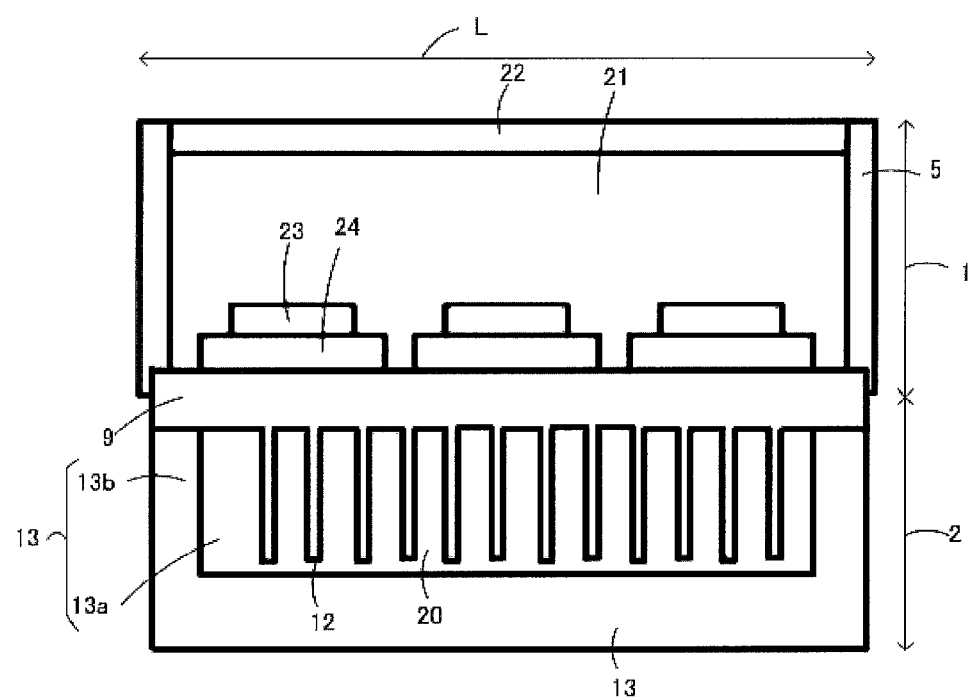
FIG. 3 is a cross-sectional diagram of the principal portions, taken along line X2-X2 of FIG. 1.
Figure 4:
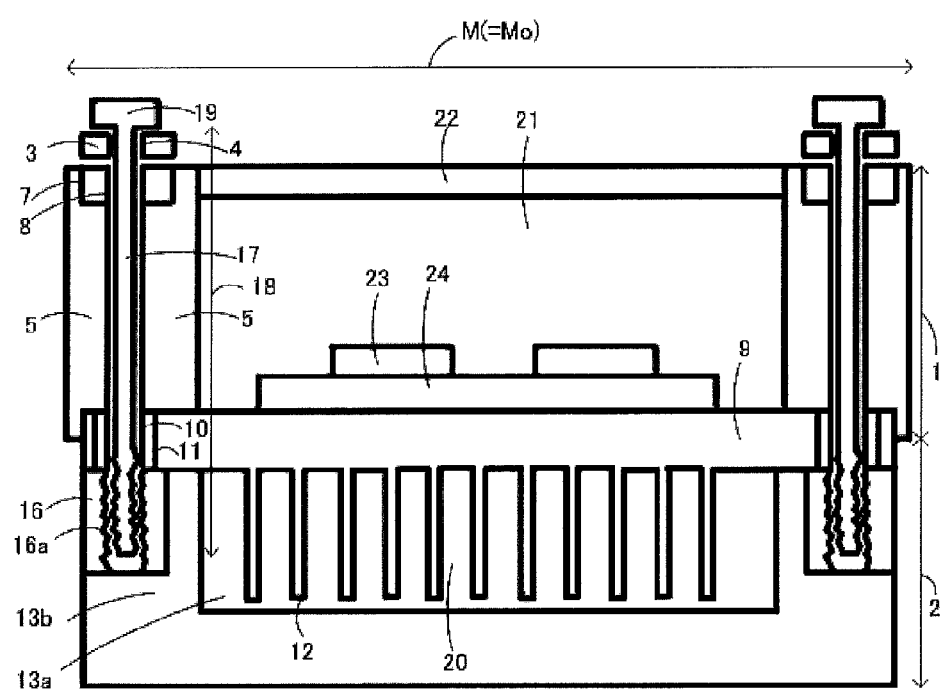
FIG. 4 is a cross-sectional diagram of the principal portions, taken along line Y-Y of FIG. 1.

FIGS. 1 to 4 are each a diagram showing a configuration of a semiconductor device 100 of an example according to the present invention. FIG. 1 is a top view of the principal portions, showing from above the semiconductor device 100 without a top lid 22. Wiring for a bolt 17 for fixing a cooler 2 and for a semiconductor chip 23 and the like are not shown. FIG. 2 is a cross-sectional diagram of the principal portions, taken along line X1-X1 of FIG. 1. FIG. 3 is a cross-sectional diagram of the principal portions, taken along line X2-X2 of FIG. 1. FIG. 4 is a cross-sectional diagram of the principal portions, taken along line Y-Y of FIG. 1.

The semiconductor device 100 has a semiconductor module 1, the cooler 2, external conductive terminals 3, nut portions 16 made of an insulation material (e.g., polymeric resin, fluororesin, ceramics, or the like), and bolts 17.

The semiconductor module 1 has semiconductor chips 23, DCB substrates 24 to which the semiconductor chips 23 are adhered, a resin frame 5 accommodating the DCB substrates 24, metallic blocks 7 embedded in the resin frame 5, the resin lid 22 disposed above the DCB substrates 24 and fitted into the resin frame 5, and a protective member 21 such as a gel that fills the resin frame 5. The lower surfaces of the DCB substrates 24 are adhered to the upper surface of a top plate 9 of the cooler 2. The external conductive terminals 3 each have a first through-hole 4 and are disposed along an outer edge of the upper surface of the resin frame 5. Second through-holes 6 communicating with the first through-holes 4 are punched in the resin frame 5. Upper portions of the second through-holes 6 are configured as through-holes 8 with expanded inner diameters, and the metallic blocks 7 are embedded therein. Embedding the metallic blocks 7 in the resin frame 5 can prevent the external conductive terminals 3 from biting into the resin frame 5 when the external conductive terminals 3 are fastened to the resin frame 5 with the bolts 17 respectively.

The cooler 2 has the top plate 9 having a plurality of fins 12 disposed on the lower surface thereof, and a bottom plate 13 with a depressed portion 13a and a side portion 13b. The space surrounded by the top plate 9 and bottom plate 13 and accommodating the fins 12 forms a refrigerant passage 20 through which a refrigerant such as water passes. The top plate 9 has third through-holes 10 that communicate with the second through-holes 6 and have inner walls thereof covered with insulation layers 11. The insulation layers 11 may each be a film made of an insulation material (e.g., polymeric resin, fluororesin, ceramics, or the like) to cover the inner wall of each third through-hole 10, or a detachable tube made of an insulation material. The side portion 13b surrounding the depressed portion 13a of the bottom plate 13 is embedded with the nut portions 16 made of an insulation material, in which screw holes 16a for female screws are threaded in alignment with the third through-holes 10. The materials for the top plate 9 of the cooler 2, the fins 12, and the bottom plate 13 are not particularly limited as long as the materials have good thermal conductivity, and metals such as aluminum can favorably be used.

The bolts 17 have shaft portions 18 that are inserted through the first through-holes 4, second through-holes 6, and third through-holes 10, screwed into the female screws of the nut portions 16 made of an insulation material, and fastens the external conductive terminals 3, the resin frame 5, the top plate 9, and the bottom plate 13 together, and head portions 19 that are connected to the shaft portions 18 and have a larger outer diameter than the first through-holes 4. The material of the bolts 17 may be metal or an insulation material (e.g., polymeric resin, fluororesin, ceramics, or the like). When the bolts 17 are made of an insulation material, it becomes unnecessary to ensure insulation by providing the nut portions 16 made of an insulation material and the insulation layers 11, so the screw holes 16 for female screws can directly be threaded into the side portion 13b of the bottom plate 13. Needless to say, even when using bolts made of an insulation material, the nut portions 16 made of metal or an insulation material and the insulation layers 11 may be provided.

Figure 7:
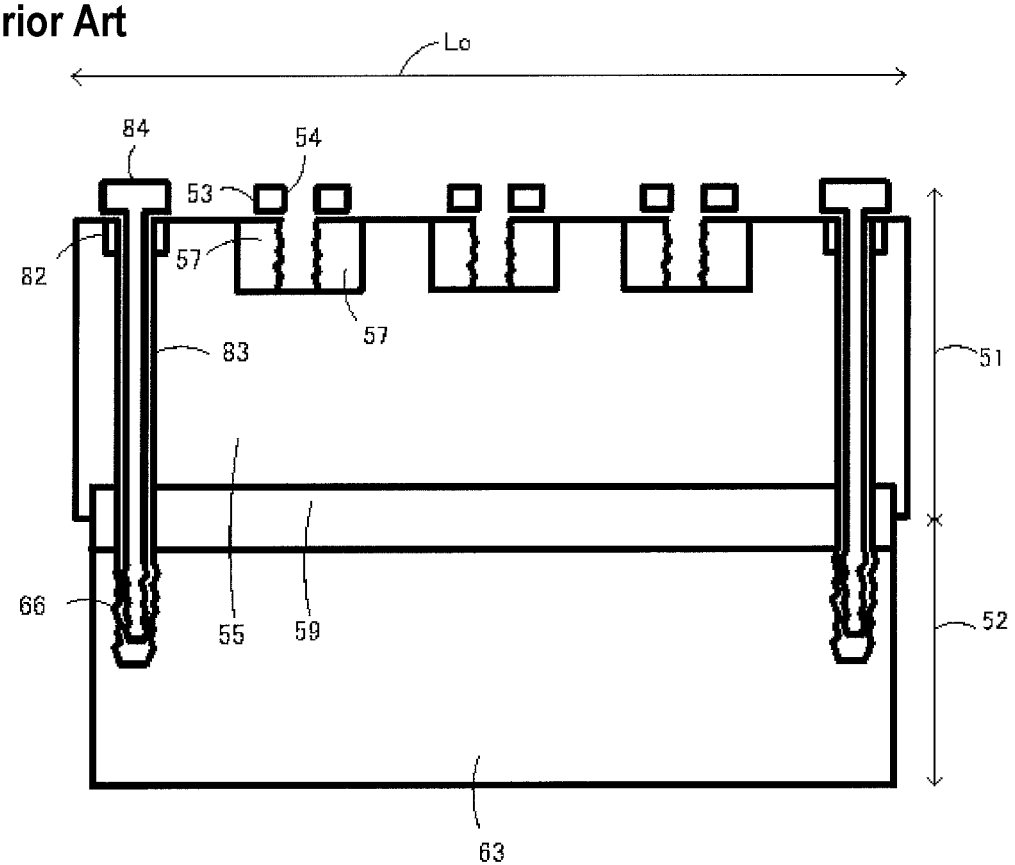
FIG. 7 is a cross-sectional diagram of the principal portions, taken along line X1-X1 of FIG. 6.
Figure 8:
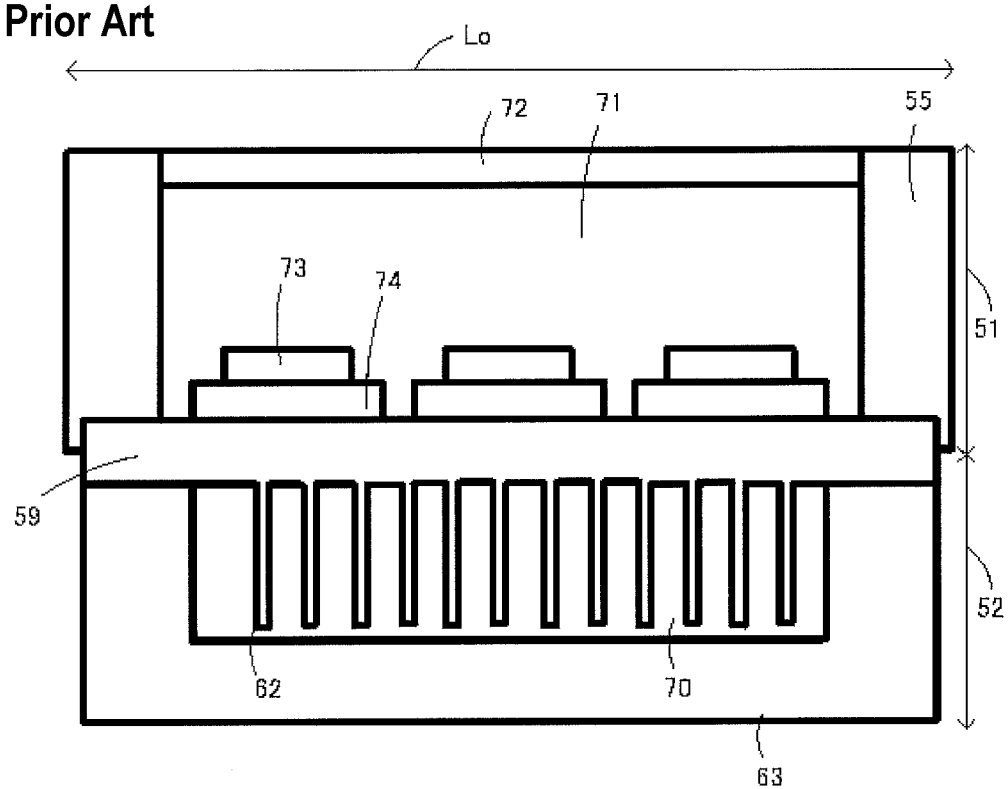
FIG. 8 is a cross-sectional diagram of the principal portions, taken along line X2-X2 of FIG. 6.
Figure 9:
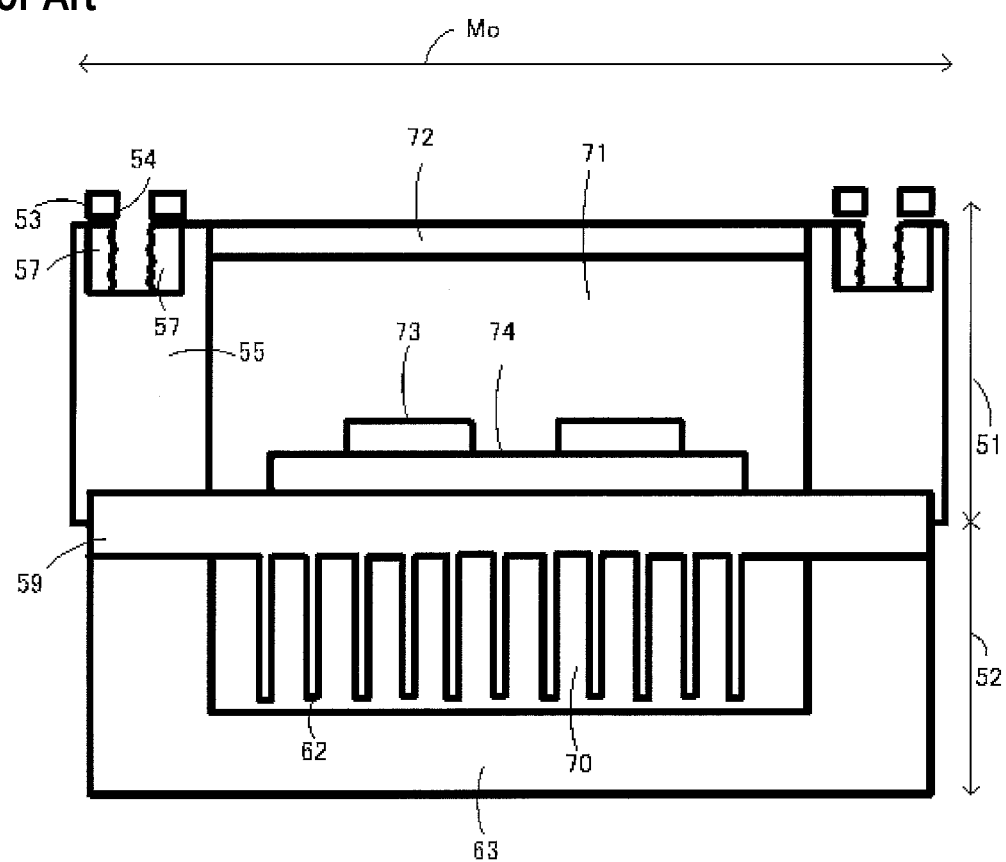
FIG. 9 is a cross-sectional diagram of the principal portions, taken along line Y-Y of FIG. 6.
Figure 10:
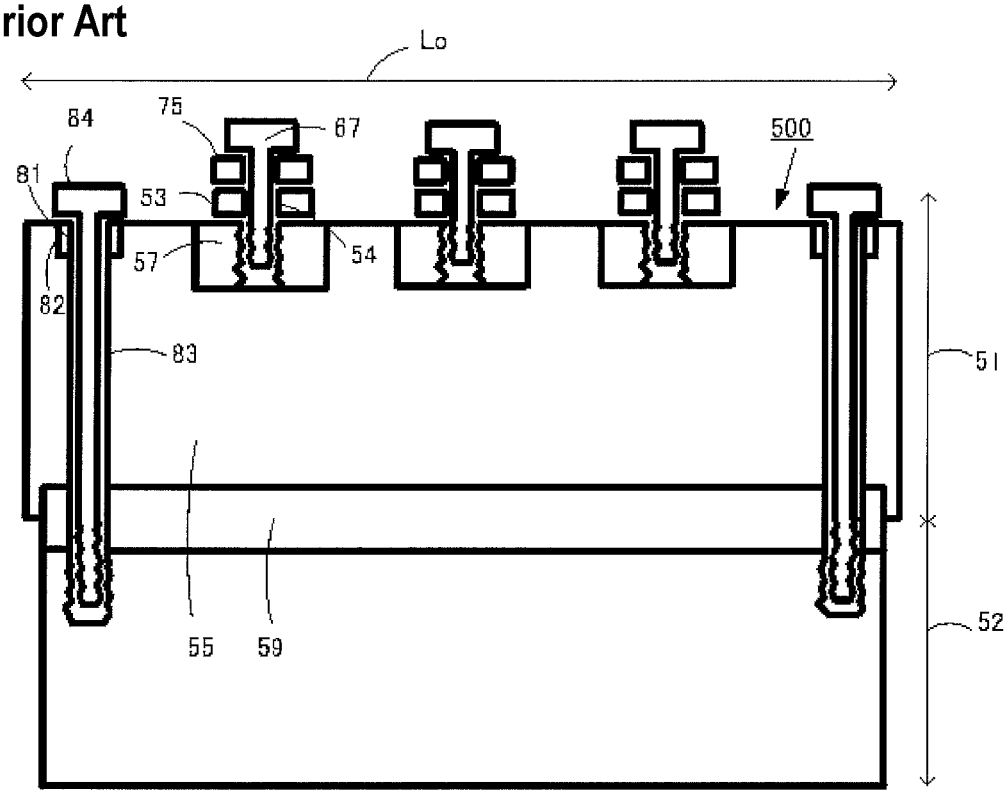
FIG. 10 is a cross-sectional diagram of the principal portions in which external wiring is connected to the semiconductor device shown in FIG. 6.

The semiconductor device 100 is completed by fixing the semiconductor module 1 and the cooler 2 to the bolts 17. This semiconductor device 100 has a width L and a length M. As the external conductive terminals 3 on the upper surface of the semiconductor device 100, P-terminals and N-terminals that receive input of a DC voltage are disposed side by side in a row, and three AC terminals that output a three-phase AC voltage are disposed side by side in a row. The second fixing holes 83 that are disposed in the conventional semiconductor device 500 as shown in FIG. 7 are not provided in the semiconductor device 100 of the present invention shown in FIG. 1. Therefore, the width of the external form can be reduced from Lo to L, and downsizing of the semiconductor device 100 can be accomplished. Specifically, the width of the semiconductor device 100 can be reduced by Lo−L=2ΔL. Downsizing the semiconductor device 100 can lead to saving of the members, and consequently cost reduction can be accomplished.

Note that in some cases, the top plate 9 mounted with the fins 12 and the semiconductor module 1 are provided by a manufacturer to a client and the client assembles these members with the bottom plate 13 to complete the semiconductor device 100. Alternatively, the semiconductor module 1, the top plate 9, and the bottom plate 13 may be temporarily fastened and fixed and shipped, and then the client may stack the external wiring 25, the external conductive terminals 3, the semiconductor module 1, and the cooler 2 in this order, tighten these members with the bolts 17, connect the external wiring 25, and then use the semiconductor device 100, as shown in FIG. 5.

Figure 5:
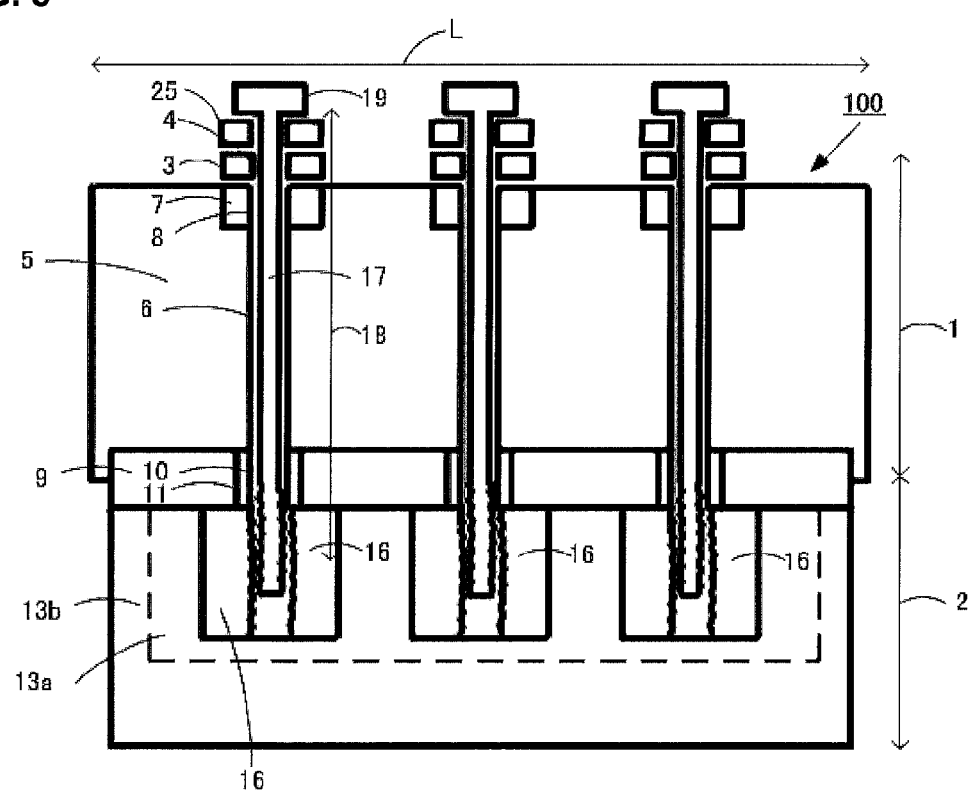
FIG. 5 is a cross-sectional diagram of the principal portions in which external wiring is connected to the semiconductor device shown in FIG. 1.
Figure 6:
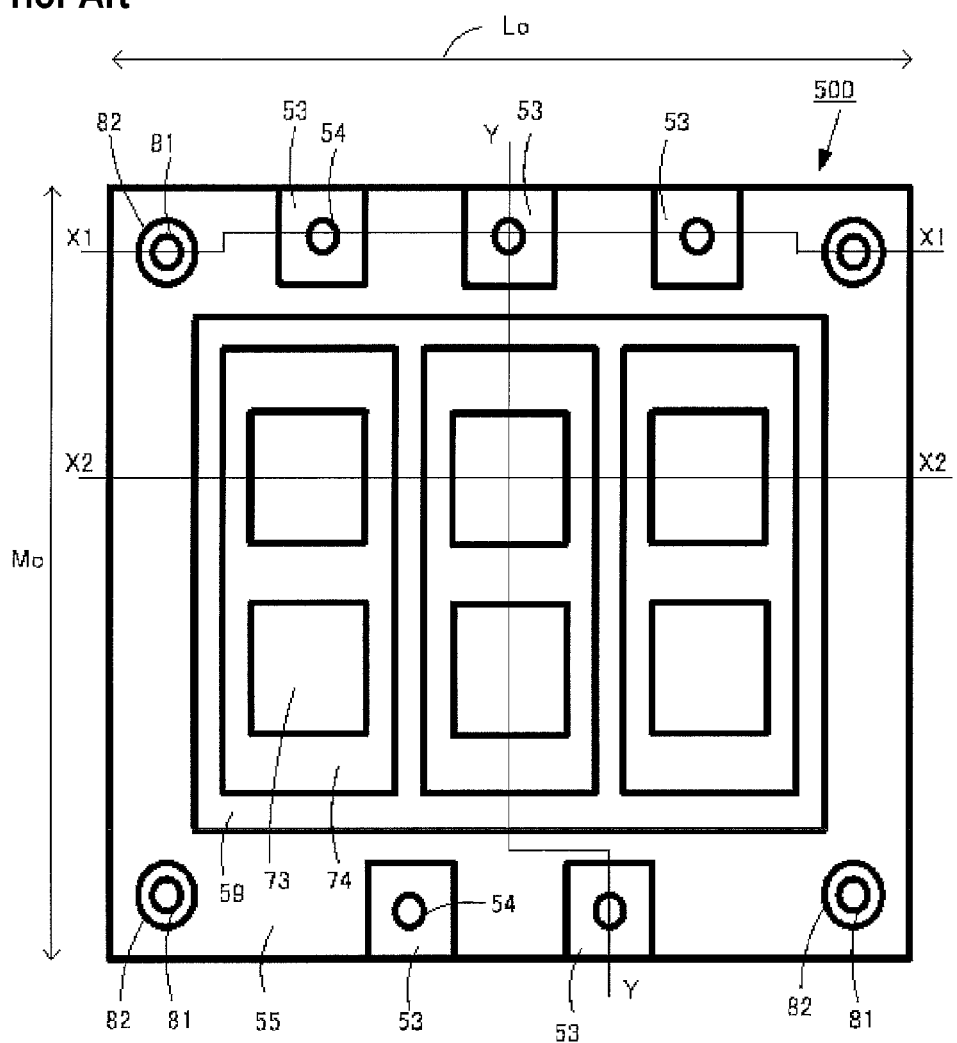
FIG. 6 is a top view of the principal portions of a conventional semiconductor device.

FIG. 5 is a cross-sectional diagram of the principal portions in which the external wiring 25 is connected to the semiconductor device 100. According to the present invention, the external wiring 25, the external conductive terminals 3, the semiconductor module 1, and the cooler 2 can be fixed all together with the bolts 17.

REFERENCE SIGNS LIST 1, 51 Semiconductor module
2, 52 Cooler
3, 53 External conductive terminal
4 First through-hole
5, 55 Resin frame
6 Second through-hole
7 Block
8, 81 Through-hole
9, 59 Top plate
10 Third through-hole
11 Insulation layer
12, 62 Fin
13, 63 Bottom plate
13a Depressed portion
13b Side portion
16 Nut portion
16a Screw hole
17, 67, 84 Bolt
18 Shaft portion
19 Head portion
20, 70 Refrigerant passage
21, 71 Protective member
22, 72 Lid
23, 73 Semiconductor chip
24, 74 DCB substrate
25, 75 External wiring
54 First fixing hole
57 Nut portion
82 Metal tube
83 Second fixing hole
100, 500 Semiconductor device
L, Lo Width
M, Mo Length
ΔL=(Lo−L)/2

What is claimed is:

1. A semiconductor device comprising a semiconductor module and a cooler bonded to each other by a bolt,
wherein the semiconductor module includes an external conductive terminal with a first through-hole, and a second through-hole that communicates with the first through-hole and disposed under the first through-hole,
the cooler has a top plate that has a third through-hole communicating with the second through-hole and has a fin adhered thereto, and a bottom plate that has a depressed portion for accommodating the fin and forming a refrigerant passage, and a side portion surrounding the depressed portion,
the side portion of the cooler includes a screw hole for a female screw aligned with the third through-hole,
the bolt has a head portion with a larger outer diameter than the first through-hole, and a shaft portion that extends from the head portion, is inserted through the first through-hole, the second through-hole, and the third through-hole, and screwed and tightened to the screw hole,
the external conductive terminal is formed not to conduct electricity to the cooler through the bolt,
the bolt, the top plate of the cooler, and the bottom plate of the cooler are made of metal,
the screw hole is a screw hole that is threaded in a nut made of an insulation material and embedded in a side portion of the cooler, and
an inner surface of the third through-hole has an insulation layer.

2. A semiconductor device comprising a semiconductor module and a cooler bonded to each other by a bolt,
wherein the semiconductor module includes an external conductive terminal with a first through-hole, and a second through-hole that communicates with the first through-hole and disposed under the first through-hole,
the cooler has a top plate that has a third through-hole communicating with the second through-hole and has a fin adhered thereto, and a bottom plate that has a depressed portion for accommodating the fin and forming a refrigerant passage, and a side portion surrounding the depressed portion,
the side portion of the cooler includes a screw hole for a female screw aligned with the third through-hole,
the bolt has a head portion with a larger outer diameter than the first through-hole, and a shaft portion that extends from the head portion, is inserted through the first through-hole, the second through-hole, and the third through-hole, and screwed and tightened to the screw hole,
the external conductive terminal is formed not to conduct electricity to the cooler through the bolt,
the bolt is made of an insulation material,
the top plate and the bottom plate of the cooler are made of metal, and the screw hole is a screw hole that is threaded in a nut made of an insulation material and is embedded in a side portion of the cooler.

3. A semiconductor device comprising a semiconductor module and a cooler bonded to each other by a bolt,
wherein the semiconductor module includes an external conductive terminal with a first through-hole, and a second through-hole that communicates with the first through-hole and disposed under the first through-hole,
the cooler has a top plate that has a third through-hole communicating with the second through-hole and has a fin adhered thereto, and a bottom plate that has a depressed portion for accommodating the fin and forming a refrigerant passage, and a side portion surrounding the depressed portion,
the side portion of the cooler includes a screw hole for a female screw aligned with the third through-hole,
the bolt has a head portion with a larger outer diameter than the first through-hole, and a shaft portion that extends from the head portion, is inserted through the first through-hole, the second through-hole, and the third through-hole, and screwed and tightened to the screw hole,
the external conductive terminal is formed not to conduct electricity to the cooler through the bolt,
the bolt is made of an insulation material,
the top plate and the bottom plate of the cooler are made of metal, and
the screw hole is a screw hole that is directly threaded to the bottom plate of the cooler.

4. A semiconductor device comprising a semiconductor module and a cooler bonded to each other by a bolt,
wherein the semiconductor module includes an external conductive terminal with a first through-hole, and a second through-hole that communicates with the first through-hole and disposed under the first through-hole,
the cooler has a top plate that has a third through-hole communicating with the second through-hole and has a fin adhered thereto, and a bottom plate that has a depressed portion for accommodating the fin and forming a refrigerant passage, and a side portion surrounding the depressed portion,
the side portion of the cooler includes a screw hole for a female screw aligned with the third through-hole,
the bolt has a head portion with a larger outer diameter than the first through-hole, and a shaft portion that extends from the head portion, is inserted through the first through-hole, the second through-hole, and the third through-hole, and screwed and tightened to the screw hole,
the external conductive terminal is formed not to conduct electricity to the cooler through the bolt,
the second through-hole is bored into a resin frame forming an outer wall of the semiconductor module, and
an upper portion of the second through-hole is a through hole with an expanded inner diameter to which a metal block is embedded.

* * * * *